United States Patent [19]
Lodi

[11] Patent Number: 4,635,811
[45] Date of Patent: Jan. 13, 1987

[54] COMPUTER MODULAR FRAME WITH RETRACTABLE STABILIZERS

[75] Inventor: Renato Lodi, Rho, Italy

[73] Assignee: Honeywell Information Systems Italia, Milan, Italy

[21] Appl. No.: 777,113

[22] Filed: Sep. 18, 1985

[30] Foreign Application Priority Data

Oct. 1, 1984 [IT] Italy ............................... 22939 A/84

[51] Int. Cl.$^4$ ............................................. B65D 19/00
[52] U.S. Cl. ..................................... 220/69; 108/51.1; 248/188.7; 248/346
[58] Field of Search ................. 220/69, 23.4; 248/151, 248/188.7, 188.8, 188.91, 346; 108/51.1

[56] References Cited

U.S. PATENT DOCUMENTS

| | | | |
|---|---|---|---|
| 3,587,453 | 6/1971 | Klein et al. | 248/188.8 X |
| 3,733,040 | 5/1973 | Rocquin | 248/188.7 X |
| 3,752,476 | 8/1973 | Mahoney | 248/188.7 X |
| 4,216,933 | 8/1980 | Cramer, Jr. | 248/346 X |

*Primary Examiner*—Steven M. Pollard
*Attorney, Agent, or Firm*—Nicholas Prasinos; John S. Solakian

[57] ABSTRACT

Computer modular housing with retractable stabilizers comprised of bearing feet shiftable relative to each other in a parallel direction, each of said bearing feet is independently movable laterally relative to the others so as to increase the frame bearing area and therefore increases the frame stability. They may also be retracted to a position which permits the assembly of modules against walls or other frames in order to form systems of juxtaposed modular units.

4 Claims, 8 Drawing Figures

COMPUTER MODULAR FRAME WITH RETRACTABLE STABILIZERS

BACKGROUND OF THE INVENTION

1. Field of the Invention

The present invention relates to modular computer housings with retractable stabilizers.

2. Description of the Prior Art

It is known that large data processing systems are comprised of a plurality of cubicles or modular boxes generally arranged next to each other and containing electronic circuits. The stability and the relative positioning of these cubicles is assured by the large size of their base bearing area and by their weight more than by any mechanical connections of cubicles with each other. However progress in electronic technology has enabled the reduction of the space required for housing of the components, and accordingly the size and weight of the housings has been considerably reduced. In fact, it is intended that these cubicles be placed side by side on top or under working desks. The height and depth limits established by this type of installation concept has reduced the module width by tens of centimeters, e.g., from 15 to 25 cm., while the height and the depth have stayed relatively constant at 60 to 80 cm. in order to obtain optimum space exploitation. Accordingly the height as it relates to its small base renders such an installation quite unstable. In fact, because the weight of such modules has been reduced to a few tens of Kg., any accidental bumps or other forces can upset the module. It is desirable, therefore for these type modules to have greater bearing areas or additional supports to avoid any risk of tipping over and to allow safe installation of these modules in an open space. It is, however, desirable that such supporting structure does not interfere with the juxtaposition of the modules against each other or against any walls, tables or other office furniture against which the modules may abut. Moreover any additional structures should not interfere with the easy handling and packaging of the smaller size.

OBJECTS OF THE INVENTION

It is accordingly a primary object of the invention to provide an improved computer modular frame.

It is another object of the invention to provide an improved computer modular frame having retractable stabilizers.

SUMMARY OF THE INVENTION

The above and other objects of the invention are obtained in a preferred embodiment of the invention. According to the invention, the effective bearing area of the modules is extended, in the direction of the minimum size (width) of a module by means of feet or stabilizers skid-mounted on the frame bottom. They can be extended from one side or from both sides of the module. When abutting against a wall or another module, the feet or stabilizers are extended from one side only. The feet increase the effective bearing area of the module when extended. In the retracted position the feet are not in view and do not extend beyond the perimeter of the cubicle base. Accordingly this allows the juxtaposition of frames or the positioning of the modules against the walls or pieces of furniture. It also provides for easier handling and packaging in small containers when the feet are in the retracted position.

The several feet are independently movable in order to increase the effective bearing area selectively. In the case of module juxtaposition, the feet permit interconnection of the different modules since one common cover can be used for several juxtaposed modules, even though their feet are extended. This assures the module's correct and safe juxtaposition.

BRIEF DESCRIPTION OF THE DRAWINGS

These advantages and the features of the invention will appear more clearly from the following description and the enclosed drawings where.

DESCRIPTION OF THE PREFERRED EMBODIMENT

Figure 1:
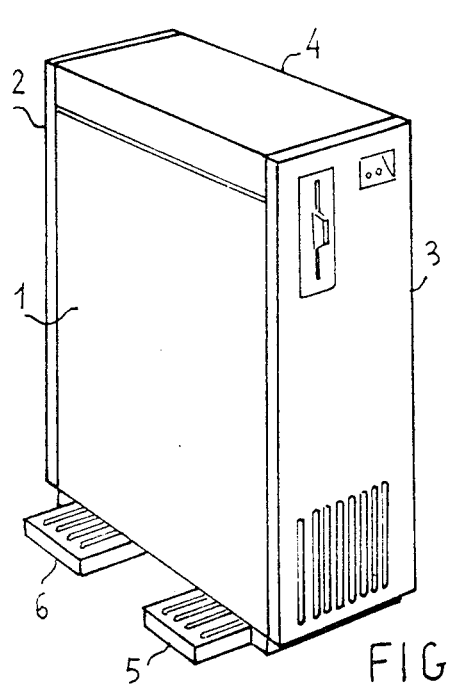
FIG. 1 shows a perspective view of a computer modular frame with retractable stabilizers.

Referring now to FIG. 1 there is shown a perspective view of a computer modular frame with retractable feet. The frame is comprised of a plate element suitably strengthened by internal stiffening ribs, not in view, and bent in a U-shape in order to form the bottom and the two lateral sides 1 and 4 for the cubicle which houses the electronic components. The frame is further comprised of a back panel 2, a front panel 3 and a cover 4. Typical sizes for this type of frame are as follows: height 67 cm., depth 57 cm., width 18 cm. The cubicle moreover is provided with a plurality of feet 5 and 6 to assure stability. Preferably three feet should be provided, but even a higher number is more desirable. The feet are skid-mounted in series along the longitudinal axis of the base, and are slidably movable transverse to this axis. Two of these feet, 5 and 6 respectively, are shown in FIG. 1 in a laterally shifted position relative to side 1. A third foot, not in sight, and positioned between feet 5 and 6 extends beyond the side opposite side 1. In this way the cubicle bearing surface is practically doubled and its stability is improved.

Figure 2:
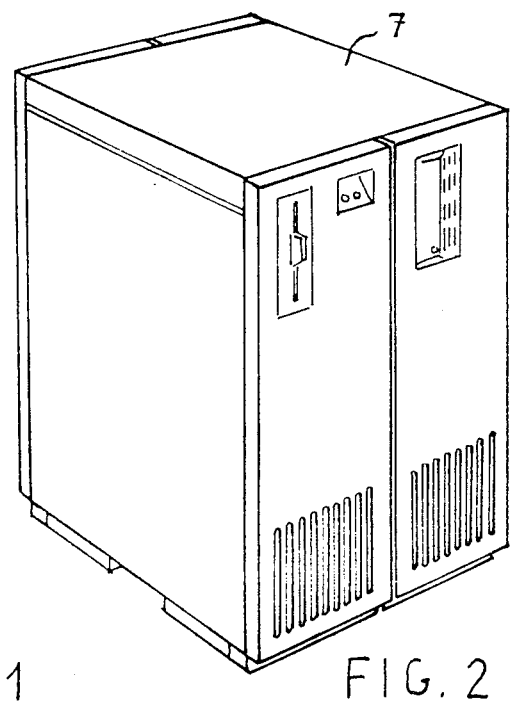
FIG. 2 shows a perspective view of a system comprised of two juxtaposed modular frames.

FIG. 2 shows a perspective view of a system comprising two juxtaposed modular frames. The frames are kept together by a common cover 7. In this case the increase of the bearing surface is not necessary and the feet are retracted underneath each cubicle in order to be aligned with the two sides of the cubicle.

Figure 4:
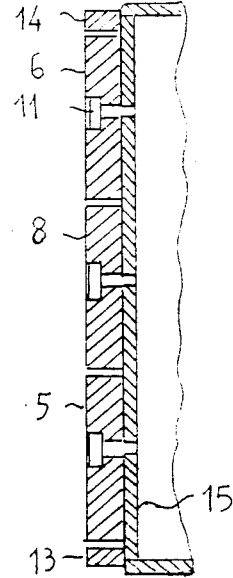
FIG. 4 shows a sectional view of the retractable feet of the modular frame.
Figure 3:
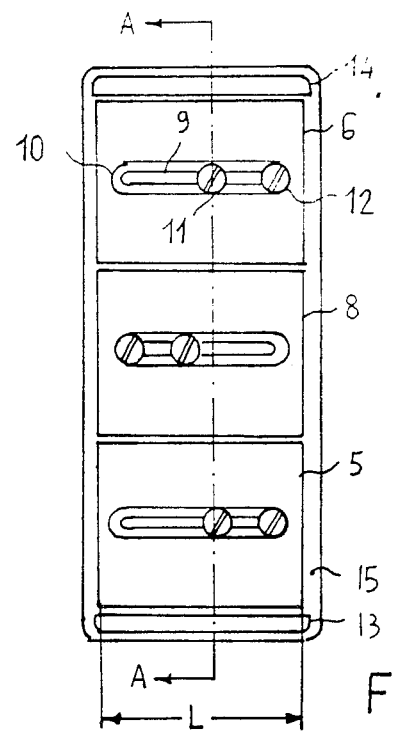
FIG. 3 shows a bottom view of a modular frame with retractable feet.

FIG. 3 shows a bottom view of the retractable feet, while FIG. 4 shows a sectional view taken along plane A—A. Three retractable feet 5, 6, 8, have a rectangular shape and are juxtaposed side by side along the longitudinal axis A—A. The length L of the feet 5, 6, 8 is, preferably, a couple of centimeters less than the cubicle width. The feet are provided with grooves similar to groove 9 and have a suitable width (e.g. 10 mm.). The grooves extend along the periphery of the feet but are slightly less than the dimensions of the feet. On the side of the feet intended to contact the floor, the grooves are typically surrounded by a seat 10 of suitable width (e.g. 20 mm.) and have suitable depth of about 5 mm. The feet are also preferably about 15 mm. thick. Each foot is fixed to the frame bottom by means of cylindrically headed screws (e.g. 11, 12 for foot 6) which pass through opening 9 and screw into bottom 15. The pair of screws 11, 12, are arranged for each foot on either side of the longitudinal axis, alternating so that alternate feet can be extended in different lateral directions. For example in FIG. 3, feet 5 and 6 can move to the right and foot 8 to the left. The ovement of each foot is completely independent from each other and therefore permits the most advantageous configuration, and thus assures the stability of the frame or of a system comprised of several juxtaposed frames. The bearing structure is completed, for aesthetic reasons, by a front socket 13 and a back socket 14 rigidly fixed to the frame bottom and having a thickness equal to one of the feet.

Figure 5:
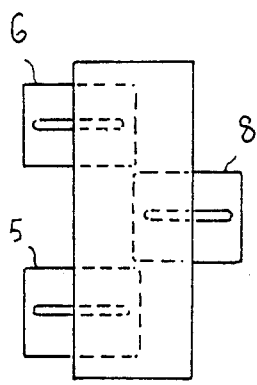
FIGS. 5, 6 and 7 schematically show a top view of possible arrangements of the feet of one or more modules in connection with different installation needs.
Figure 6:
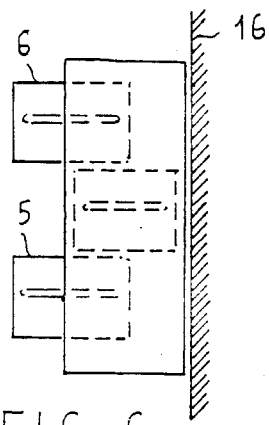
Figure 7:
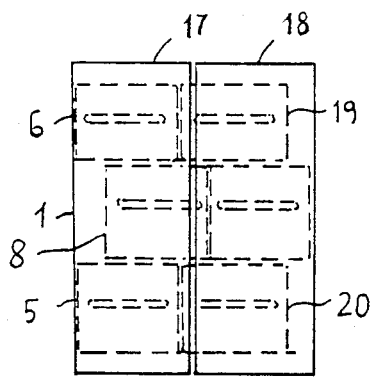

FIGS. 5, 6, 7 schematically show, in plan view, typical arrangements of the bearing feet relative to the frame plan and to the different installation needs. In FIG. 5 all the feet are laterally shifted for installation of the frame in an open space. In FIG. 6 only feet 5 and 6 are laterally shifted from one side for installation of the frame next to a vertical wall 16. In FIG. 7 two frames 17, 18 are juxtaposed to comprise a system. The frame juxtaposition is possible because the feet are interleaved with one another. Feet 5 and 6 of frame 17 are aligned with side 1, in order that feet 19 and 20 of frame 18 can be slightly laterally-shifted and inserted under frame 17. Foot 8 of frame 17 is laterally shifted slightly in order to be inserted under frame 18 and partially fit in between feet 19 and 20. To obtain this interleaving without having the feet extending beyond the perimeter of the frames, it is necessary that the foot length is slightly shorter than the frame width, typically by about 2 cm. This kind of system can be installed in an open space as well as next to a wall. It is obvious that in the case of open space installation the bearing surface can be increased when the feet are moved completely outward. The bearing feet of the disclosed embodiment can be advantageously used to comprise a unitary system by the composition of several modules and by utilizing a common cover. FIG. 2 shows such a system of two modules provided with a common cover.

Figure 8:
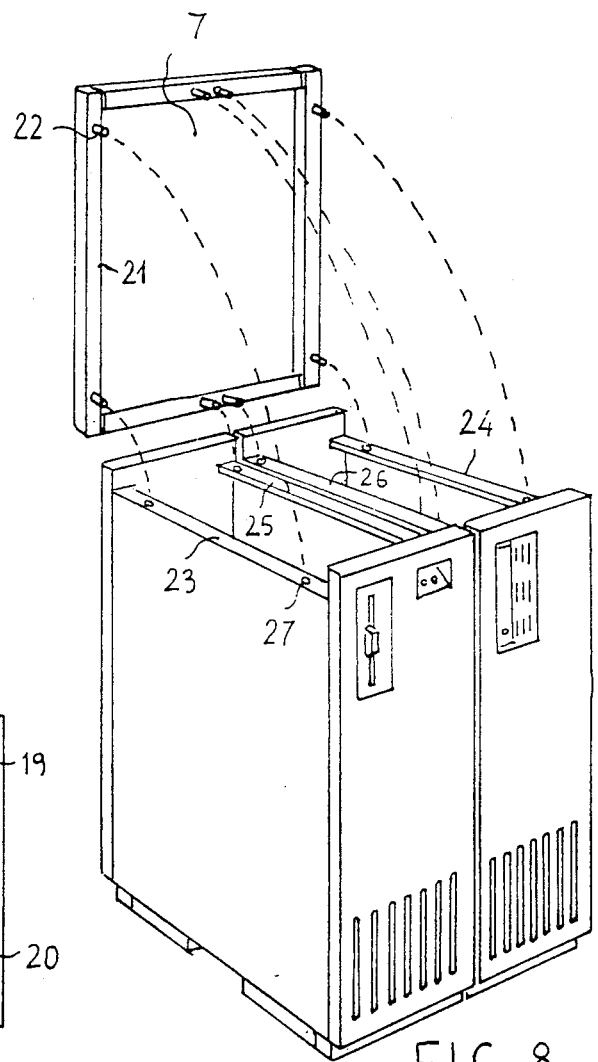
FIG. 8 shows a perspective view of the system of FIG. 2 with its cover removed.

FIG. 8 shows an exploded perspective view of the same systems having a common cover 7 removed so as to see the internal portion of the cover and modules. Cover 7 is comprised of a bent rim 21 with typical register pins 22. The upper edges 23, 24, 25, 26 of the sides are bent inward forming an angle-iron in order to stiffen the covers and permit a firm ledge as bearing surface for the covers. These ledges are pierced to allow the insertion of the cover register pins. (Only one of these openings is numbered with reference numeral 27.) Pins and openings preferably comprise pairs of "fasteners". The interleaving of the feet to the base of the frame prevents the relative shift of the module bases while the unitary cover prevents relative shifts of the modules at the tops and vibration of the same. The common cover, when used, as well as the fasteners if made from conductive material, can further comprise an electrical conductive element and a ground element for the modules, without requiring any ground cabling among the modules.

It is clear that the above description refers to preferred embodiments of the invention and that several modifications can be made without departing from the spirit and scope of the invention. For example, the retractable feet can be attached to the frame by means of slide guides where the feet are inserted, or the position slot-fixing screws can be reversed by having a sliding slot on the frame bottom and screwing the fixing screws of the restractable feet to the feet themselves. It should be noted that a cover of the above-disclosed type, common to several modules allows the electrical connection between contiguous and juxtaposed modules by housing the electrical cables in a free space between cover and juxtaposed sides of the modules. In this way the module system presents an aesthetic appearance.

What is claimed is:

1. Computer modular frame capable of juxtaposition against a wall and/or against other similar frames, comprising:

N retractable feet where $N \geq 3$, each of said feet being shaped as a substantially rectangular foot and movably skid-mounted on the bottom of said frame and shiftable in a direction transverse to the longitudinal axis of said frame, two sides of said rectangular foot being parallel to said shifting direction, said N feet being serially mounted in juxtaposition, along said longitudinal axis, at least two of said feet in juxtaposition one to the other with each being shiftable in an opposite direction of said shifting direction.

2. Modular frame as per claim 1 characterized in that said N feet have a length, in said-shifting direction, at least 2 cm less than the edges of the frame so as to leave a recess below said frame.

3. Modular frame system comprised of at least a pair of modular frames as per claim 2, arranged side by side and juxtaposed in said shifting direction, characterized in that the feet of said pair of modular frames are shifted so as to be interleaved; i.e. those of one frame interleaved to those of another frame, and in that a common cover is provided for all modules so arranged to rigidly lock said modular frames.

4. Modular frame system comprised of at least a first and second modular frame as per claim 1, arranged side by side and placed in said shifting direction, characterized in that the feet of said first and second modular frames are shifted so as to be interleaved with the ones of the first frame with the ones of the second frame, and in that a common cover is provided for all modules so arranged, thus rigidly locking in said modular frames.

* * * * *